(12) United States Patent
Garreau

(10) Patent No.: US 6,425,101 B1
(45) Date of Patent: Jul. 23, 2002

(54) PROGRAMMABLE JTAG NETWORK ARCHITECTURE TO SUPPORT PROPRIETARY DEBUG PROTOCOL

(75) Inventor: Olivier Garreau, Santa Clara, CA (US)

(73) Assignee: Infineon Technologies North America Corp., San Jose, CA (US)

( * ) Notice: Subject to any disclaimer, the term of this patent is extended or adjusted under 35 U.S.C. 154(b) by 0 days.

(21) Appl. No.: 09/183,620

(22) Filed: Oct. 30, 1998

(51) Int. Cl.$^7$ .............................. G01R 31/28
(52) U.S. Cl. .................................... 714/727
(58) Field of Search ............ 714/1, 2, 25, 27, 714/30, 37, 39, 42, 47, 718, 719, 724, 725, 726, 727, 728, 729, 730, 731, 732, 733, 734, 735, 736, 737, 738

(56) References Cited

U.S. PATENT DOCUMENTS

| | | | |
|---|---|---|---|
| 4,860,290 A | | 8/1989 | Daniels et al. |
| 5,150,044 A | * | 9/1992 | Hashizume et al. ...... 324/763 |
| 5,448,575 A | * | 9/1995 | Hashizume ............. 714/727 |
| 5,581,565 A | | 12/1996 | Meyer |
| 5,636,227 A | * | 6/1997 | Segars ................ 714/729 |
| 5,680,634 A | * | 10/1997 | Estes .................. 712/15 |
| 5,751,736 A | * | 5/1998 | Deroux-Dauphin et al. 714/726 |
| 5,828,824 A | * | 10/1998 | Swoboda ................ 714/25 |
| 5,862,152 A | * | 1/1999 | Handley et al. ......... 714/727 |
| 5,878,051 A | * | 3/1999 | Sharma et al. .......... 714/724 |
| 5,983,378 A | * | 11/1999 | De Wit et al. .......... 714/727 |
| 6,115,763 A | * | 9/2000 | Douskey et al. .......... 710/72 |

FOREIGN PATENT DOCUMENTS

| | | |
|---|---|---|
| EP | 0 735 478 A1 | 10/1996 |
| GB | 2 276 010 A | 9/1994 |

OTHER PUBLICATIONS

IEEE 1149.1 Sandard, "IEEE Standard Test Access Port and Boundary–Scan Architecture", 1993.*

* cited by examiner

Primary Examiner—Phung M. Chung
Assistant Examiner—Joseph D. Torres
(74) Attorney, Agent, or Firm—Fish & Richardson P.C.

(57) ABSTRACT

An apparatus capable of testing a plurality of JTAG compliant integrated circuits where at least one of the integrated circuits includes an enhanced embedded debug module is described. The apparatus is capable of selectively testing certain of the integrated circuits located at specified locations. In this way, integrated circuits included in a target device having defective or missing integrated circuits can still be tested. The apparatus also allows access to enhanced JTAG debug protocol within a mixed IC (OCDS and non-OCDS) network.

15 Claims, 10 Drawing Sheets

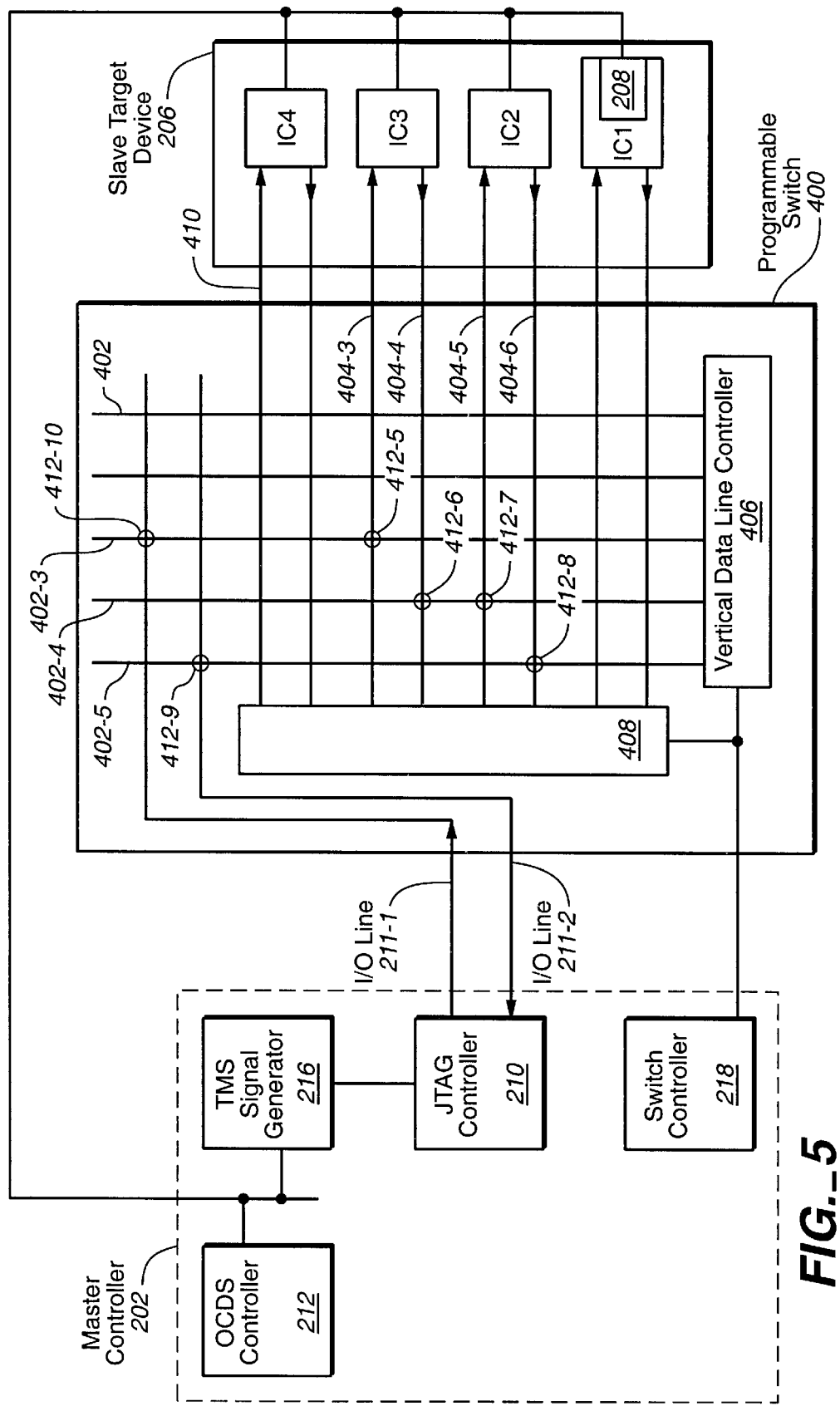
FIG._5

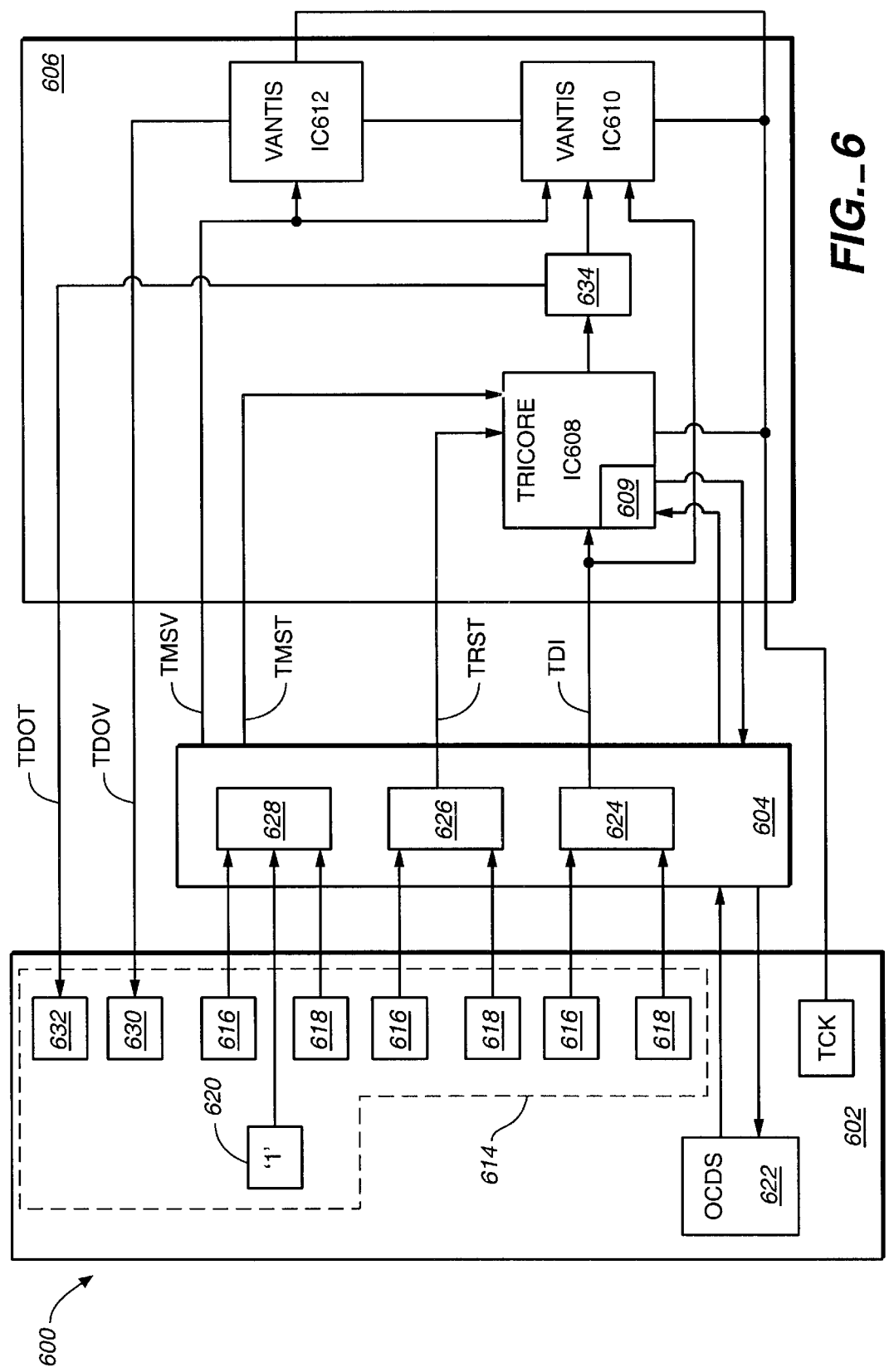

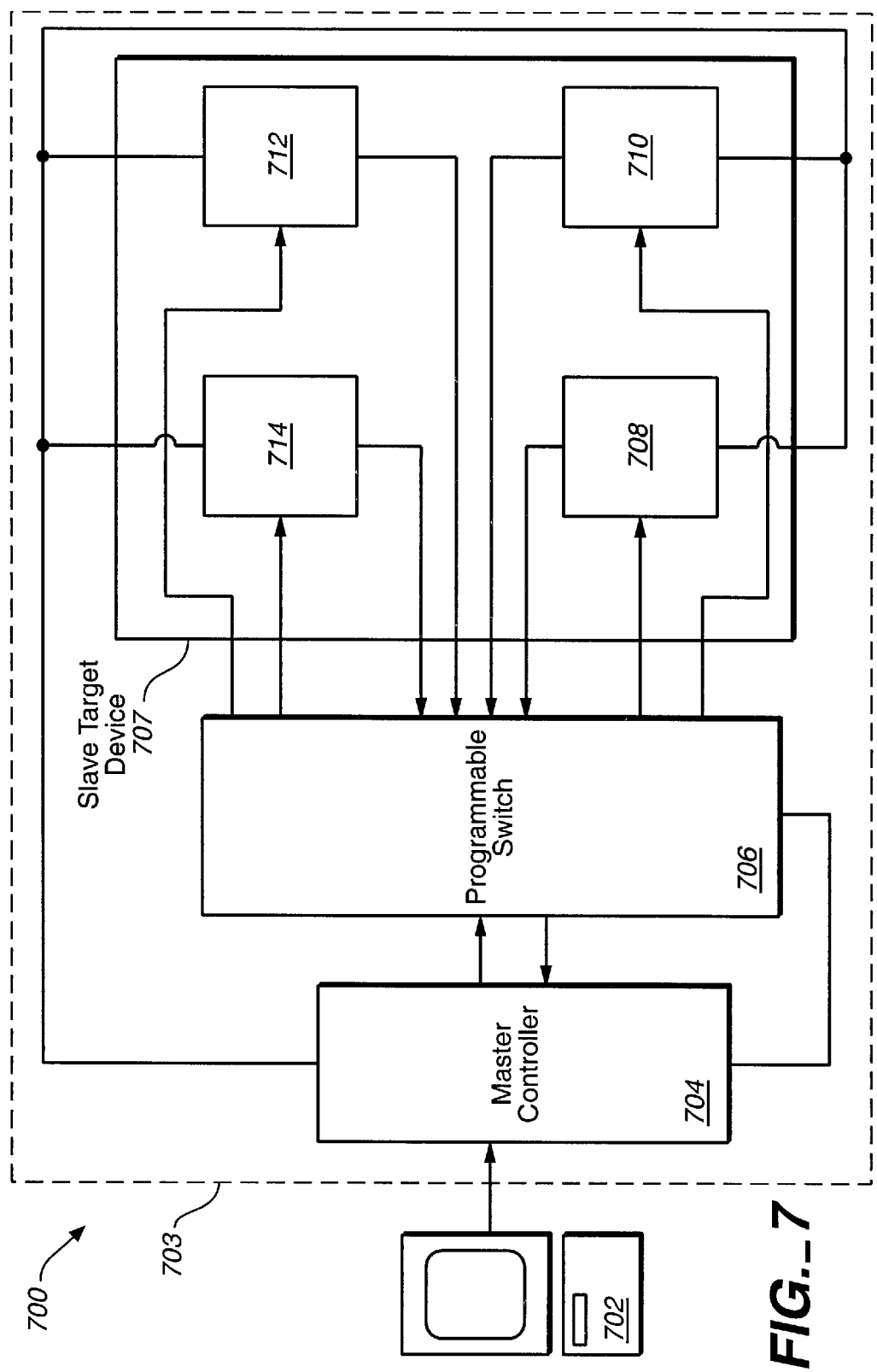
FIG._7

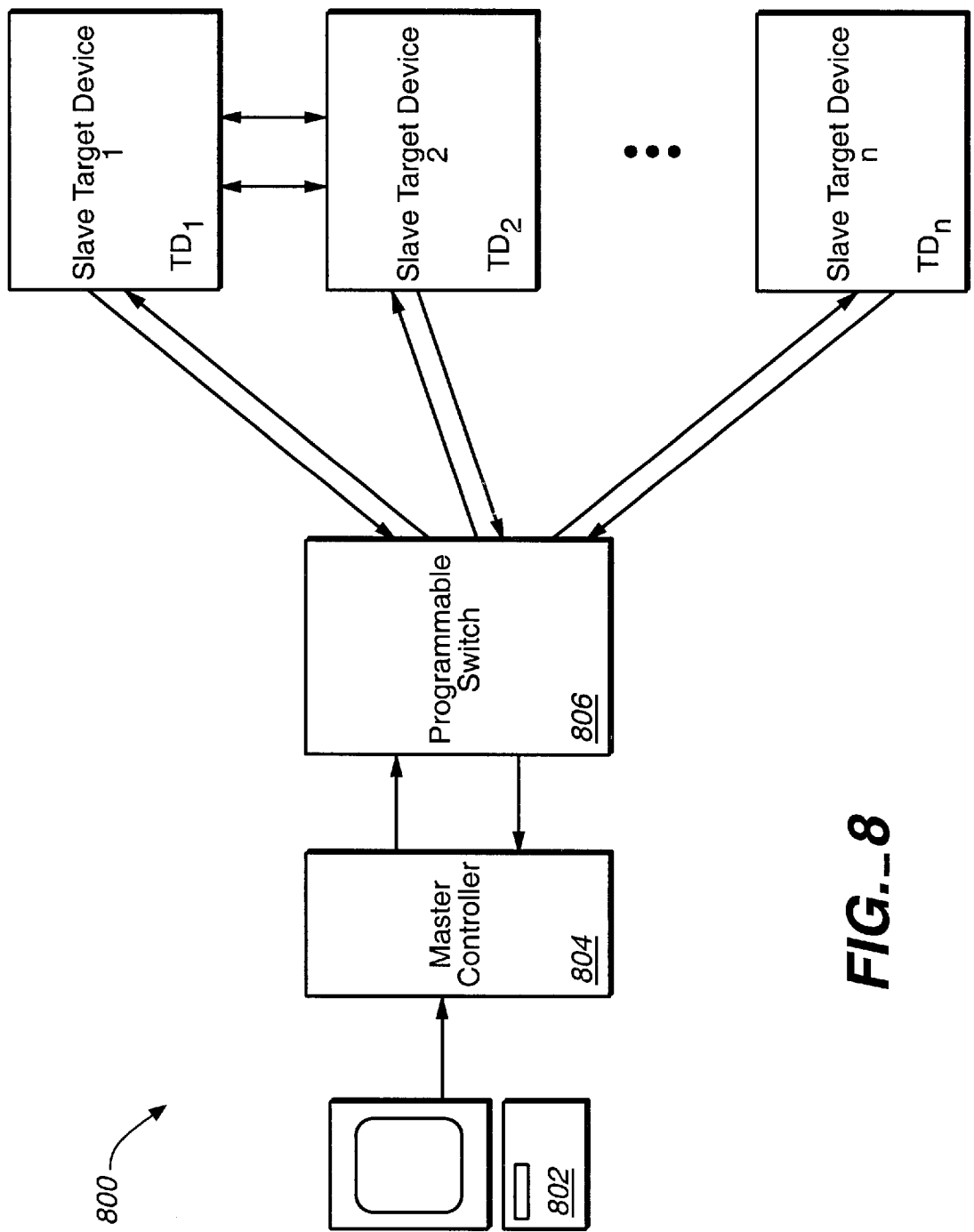
FIG._8

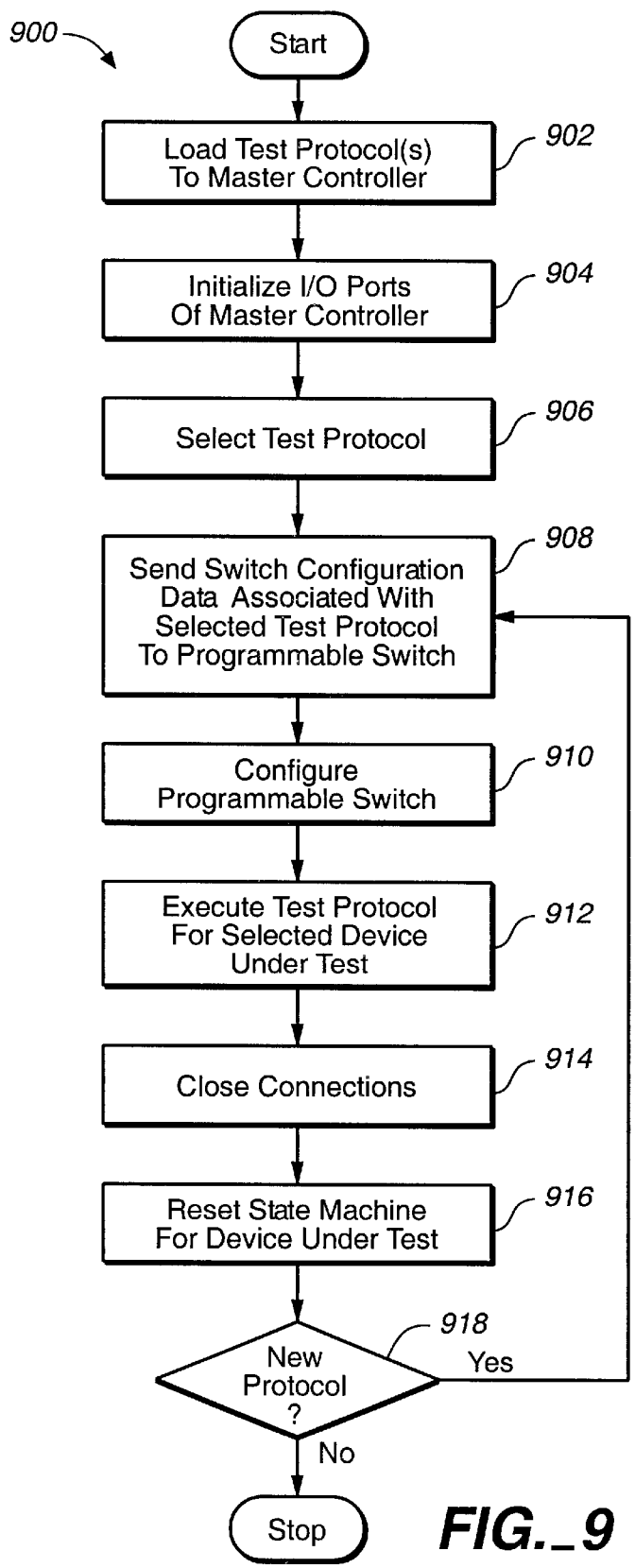
FIG._9

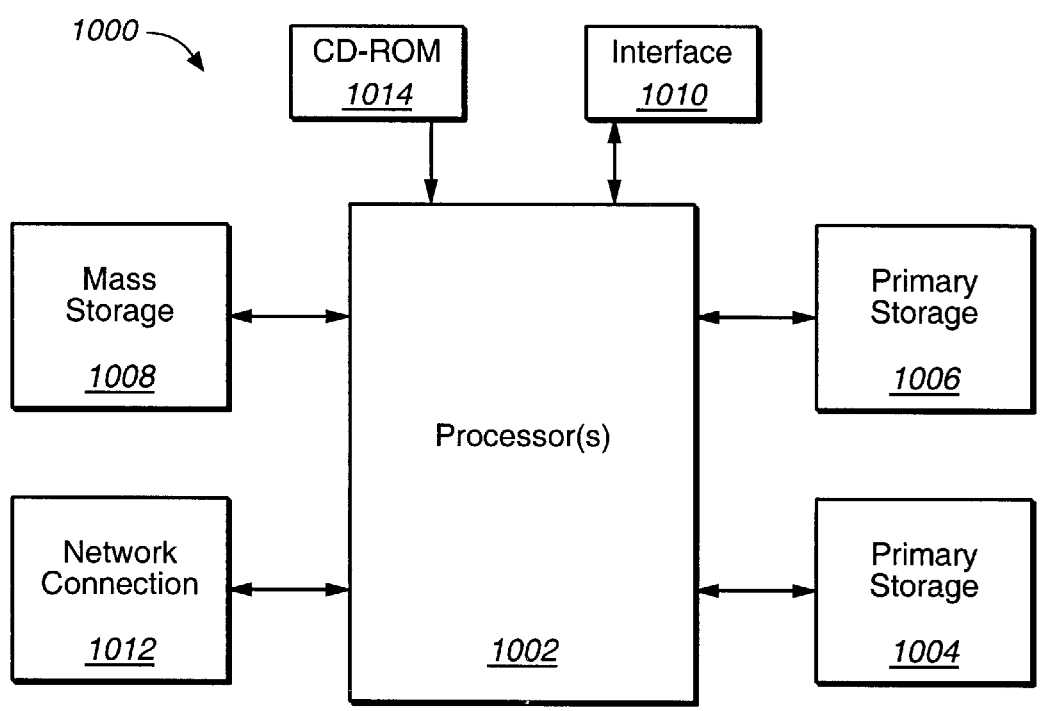
FIG._10

PROGRAMMABLE JTAG NETWORK ARCHITECTURE TO SUPPORT PROPRIETARY DEBUG PROTOCOL

FIELD OF THE INVENTION

The present invention pertains to integrated circuits. More specifically, the present invention relates to a method and a system for testing and debugging integrated circuits.

BACKGROUND OF THE INVENTION

It should be noted that throughout this document, test protocols will be construed to generally include debug protocols.

Circuits are commonly constructed on printed circuit boards (PC boards). These circuits are often complex and can include a large number of integrated circuits (ICs), where the ICs can be incorporated into a wide variety of packages. The number of ICs and the variety of packages on a PC board makes the functionality of the ICs and the interconnect between them difficult to test.

In order to test complex PC board circuits, test architectures and test buses such as boundary scan tests have been developed and are well known in the art. An IEEE standard for this type of test (defined by generic signals TCK, TMS, TDI, TDO, TRST) architecture has been developed and is known as IEEE 1149.1 or JTAG. However, for a boundary scan test to effectively verify a PC board circuit under IEEE 1149.1 standard, each of the ICs on the PC board to be tested must include an associated test architecture (referred to as boundary scan) that is also JTAG compliant.

FIG. 1 illustrates a conventional JTAG compliant test architecture 100. The test architecture 100 includes a master controller 102 connected to a slave JTAG target 104 by way of JTAG compliant connectors 106 and 108. The JTAG target 104 includes a serial register chain 110 formed of serially interconnected integrated circuits IC 112 through IC 118. During a boundary scan test, the master controller 102 serially scans and tests a predetermined series of databits that contains both the control and data information into the serial register chain 110. Typically, this control and data information is provided by a particular test protocol executed by the master controller 102 specific for the boundary scan test being performed. The control information controls a state machine included in on each of IC 112 through 118. The state machine in turn uses registers and the supplied data information to test the board interconnects (120 through 124) and the associated ICs. One of the registers on each IC is a boundary scan register that includes all the input, output, and input/output ports on the IC.

In some situations, it may not be desirable to test one or more of the integrated circuits included in the slave device 102. In such a case, a software "bypass" is performed by using the JTAG instruction "BYPASS" prior to the start of the boundary scan test to bypass these integrated circuits. In order to bypass a particular integrated circuit(s), a "BYPASS" JTAG instruction specific to the integrated circuit(s) to be bypassed is generated. The state machine included in the integrated circuit responds to the bypass instruction by causing any received data and control information to bypass the internal circuitry of the integrated circuit. This, in effect, removes the particular IC from the boundary scan test being performed.

However, in some cases, defects within an integrated circuit prevent a software bypass from being performed. In such a case, it would be impossible to perform an accurate boundary scan test within the test architecture 100 since it would be impossible to bypass the defective integrated circuit. Therefore, in order to properly test the remaining integrated circuits, physical replacement of the defective integrated circuit would be required. In complex circuit boards, the removal and replacement of a particular integrated circuit may be too costly in time or expense to be practical.

By embedding debug circuitry within integrated circuits, designers have been able to greatly enhance the capability to economically debug integrated circuits reducing the costs of design and implementation. This is especially desirable for complex and expensive integrated circuits such as microprocessors and the like. Therefore, integrated circuit manufacturers are highly motivated to include such on chip debug capabilities in their most complex and costly integrated circuits. However, the test architecture 100 is incapable of supporting embedded and proprietary debug protocols developed by, for example, Siemens Microelectronics, Inc. of San Jose, Calif., since the JTAG connectors 106 and 108 cannot be used to carry the required debug information to the JTAG target 104.

In view of the foregoing, it is desirable to provide an improved and programmable JTAG network architecture which supports embedded debug protocols.

SUMMARY OF THE INVENTION

An apparatus for testing a plurality of integrated circuits where each of the integrated circuits has an associated test protocol and at least one of the integrated circuits has an associated on-chip debug protocol is disclosed. More specifically, the apparatus includes a master controller operable to perform the test protocol associated with each of the integrated circuits including the on-chip debug protocol. The apparatus also includes a programmable switch for selectively forming test loops between the master controller and selected ones of the integrated circuits as directed by the master controller according to configuration data. The test loops facilitate execution of selected ones of the test protocols. The apparatus includes a data bus for connecting the master controller to each of the integrated circuits. The data bus is configured to transmit data and control signals between the master controller and the integrated circuits, as well as for facilitating execution of the on-chip debug protocol.

In one preferred embodiment, the master controller includes a JTAG controller connected to the data bus that is configured to execute a JTAG test protocol as well as an On-Chip-Debug-Support (OCDS) controller connected to the data bus that is configured to execute the OCDS test protocol. The master controller also includes a programmable switch controller connected to the programmable switch configured to provide a switch control signal to the programmable switch controller which responds by connecting the JTAG controller, as needed, to the integrated circuit being tested.

A test system for testing JTAG compliant integrated circuits and JTAG compliant integrated circuits having on-chip debug support (OCDS) integrated circuits is also disclosed. In a preferred embodiment, a host computer connected to the master controller provides selected test protocols, as needed, to the master controller.

Another aspect of the invention includes a printed circuit board. The printed circuit board includes a plurality of integrated circuits. Each of the integrated circuits has an associated test protocol and at least one of the integrated circuits includes an embedded debug circuit. The embedded debug circuit, in turn, has an associated on-chip debug protocol. The printed circuit board also includes a plurality of conductors for forming test loops between each of the integrated circuits and external test circuitry. The test loops facilitate execution of selected ones of the test protocols. The printed circuit board also includes a data bus connected to each of the integrated circuits. The data bus is configured to transmit data and control signals between the integrated circuits and the external test circuitry. The data bus also facilitates execution of the on-chip debug protocol.

A method for testing a plurality of integrated circuits using a master controller and a programmable switch to selectively connect the master controller with selected ones of the integrated circuit is also disclosed. Each integrated circuit has an associated test protocol and at least one of the integrated circuits includes an embedded debug circuit having an associated on-chip debug protocol. The method includes the following operations: providing the test protocols to the master controller; selecting a first test protocol; transmitting first switch configuration data associated with the first test protocol to the programmable switch; configuring the programmable switch according to the first switch configuration data to connect the master controller to at least one of the integrated circuits; executing the first test protocol; resetting the programmable switch thereby disconnecting the master controller from the at least one of the integrated circuits; and resetting a state machine associated with the at least one of the integrated circuits.

A computer program product for facilitating testing of a plurality of integrated circuits using a master controller and a programmable switch to selectively connect the master controller with selected ones of the integrated circuit is also disclosed. In one aspect, each integrated circuit has an associated test protocol and at least one of the integrated circuits includes an embedded debug circuit having an associated on-chip debug protocol. The computer program product includes at least one computer-readable medium and a computer program mechanism embedded in the at least one computer-readable medium. The computer program mechanism causes a computer to perform the following operations: providing the test protocols to the master controller; selecting a first test protocol; transmitting first configuration data associated with the first test protocol to the programmable switch thereby configuring the programmable switch according to the first configuration data to connect the master controller to at least one of the integrated circuits; directing the master controller to execute the first test protocol; directing the master controller to reset the programmable switch thereby disconnecting the master controller from the at least one of the integrated circuits; and directing the master controller to reset a state machine associated with the at least one integrated circuits.

The described arrangements have numerous advantages and eliminate the need to physically remove defective (or absent) integrated circuits in order to perform certain board level tests. In addition, the invention allows full use of powerful embedded enhanced on chip debug-support features in addition to conventional JTAG test circuits. The invention also provides for testing of any number of different integrated circuits mounted to any number of slave target devices (including printed circuit boards) either local or remote, such as in multiprocessor computer systems. The described invention works well with any integrated circuit requiring functional testing, including but not limited to microprocessors and the like.

BRIEF DESCRIPTION OF THE DRAWINGS

The present invention is illustrated by way of example, and not by way of limitation, in the figures of the accompanying drawings in which like reference numerals refer to similar elements and in which:

FIG. 5 illustrates a test circuit configured to perform a boundary scan test on selected integrated circuits in accordance with an embodiment of the invention;

FIG. 6 is an illustration of a test network having both OCDS type integrated circuits and JTAG compliant only integrated circuits in accordance with an embodiment of the invention;

FIG. 7 is a test system in accordance with an embodiment of the invention;

FIG. 8 is an illustration of a test system having a plurality of slave target devices;

FIG. 9 is a flowchart detailing a process of using the test network to test integrated circuits in accordance with an embodiment of the invention; and FIG. 10 illustrates a typical computer system in accordance with an embodiment of the invention.

DETAILED DESCRIPTION OF THE PREFERRED EMBODIMENTS

In the following detailed description of the present invention, numerous specific embodiments are set forth in order to provide a thorough understanding of the invention. However, as will be apparent to those skilled in the art, the present invention may be practiced without these specific details or by using alternate elements or processes. In other instances well known processes, procedures, components, and circuits have not been described in detail so as not to unnecessarily obscure aspects of the present invention.

Figure 1:
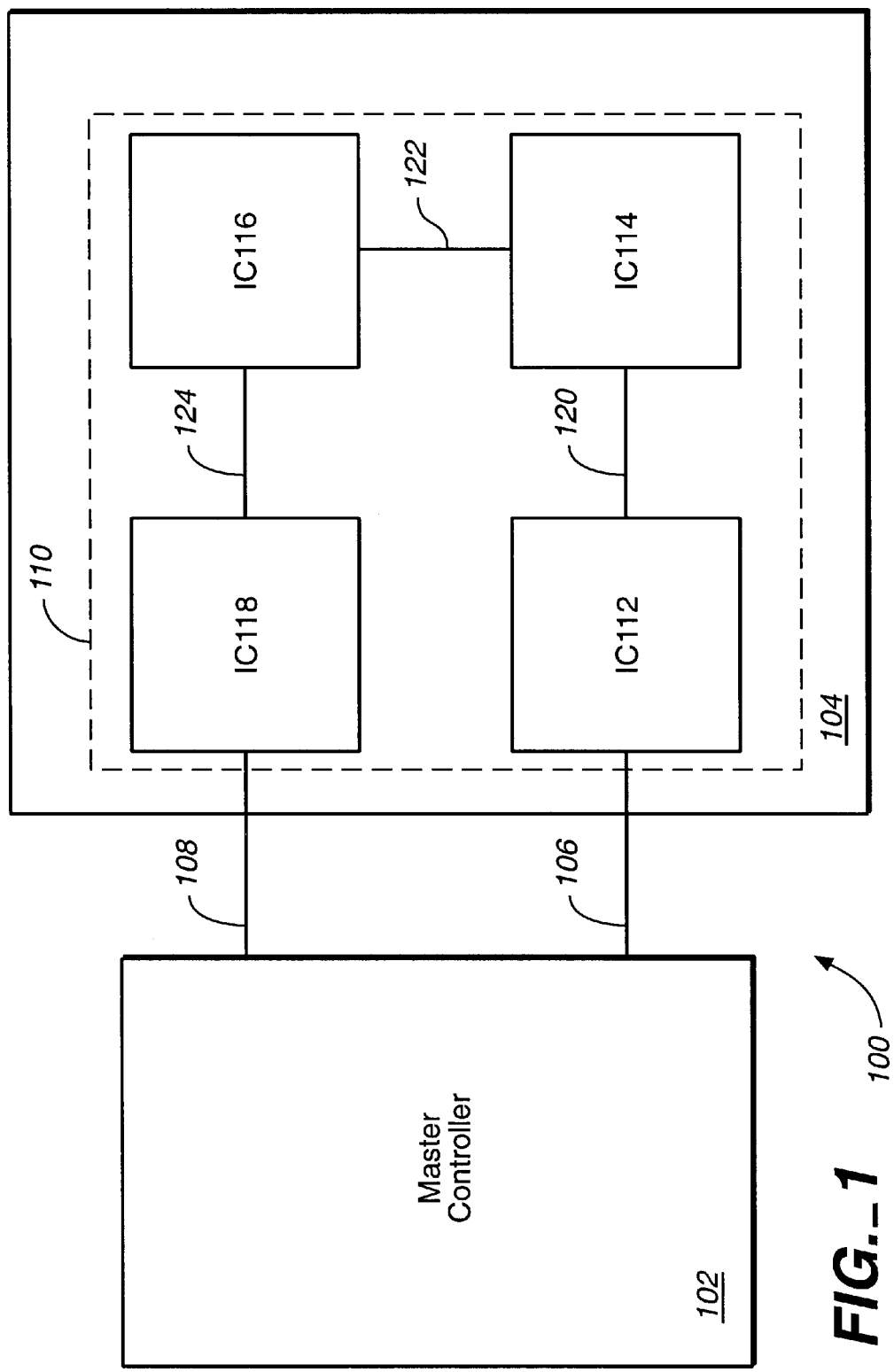
FIG. 1 is a conventional JTAG test network.
Figure 2:
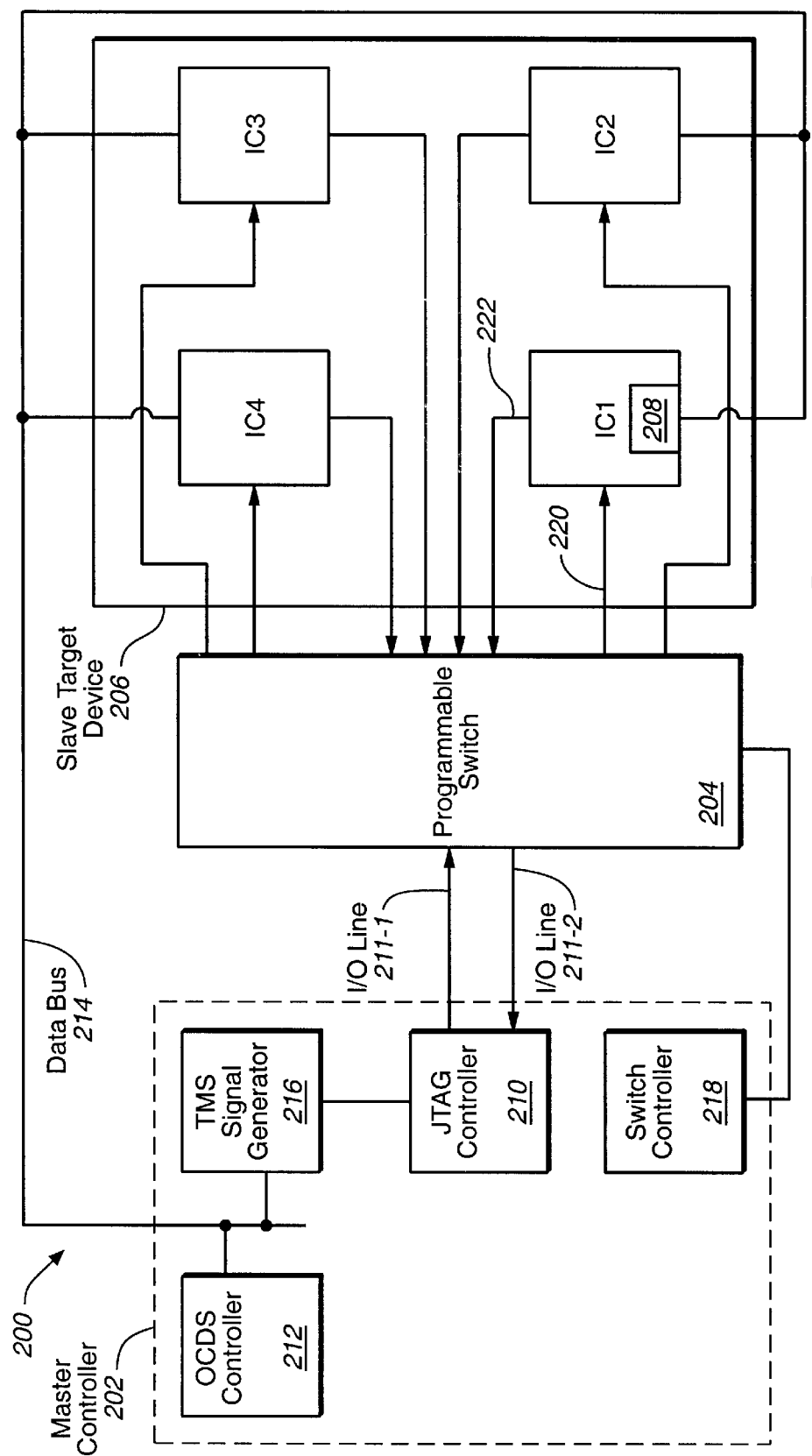
FIG. 2 is a test network in accordance with an embodiment of the invention.

Referring initially to FIG. 2, an illustration of a test network 200 in accordance with an embodiment of the invention is shown. The test network 200 includes a master controller 202 connected to a programmable switch 204. The programmable switch 204, in turn, is connected to a slave target device 206 containing JTAG compliant integrated circuits IC1 through IC4. In a preferred embodiment of the invention, at least one of the integrated circuits IC1 through IC4 is an on-chip debug support (OCDS) integrated circuit having an on-chip debug circuit. Therefore, for sake of this discussion only, it will be assumed that IC1 is an OCDS type integrated circuit having an OCDS circuit 208 while IC2 through IC4, although JTAG compliant, include only a JTAG test circuit (not shown). It should be noted, in practice that any, or all, or even none, of the integrated circuits IC1–IC4 can be OCDS type integrated circuits.

In a preferred embodiment of the invention, the master controller 202 contains a JTAG controller 210 connected to the programmable switch 204 by way of I/O lines 211-1 and 211-2. The JTAG controller 210 provides JTAG test protocols used by JTAG test circuitry included in JTAG compliant integrated circuits. As is known in the art, test protocols typically include instructions, such as test vectors, used by corresponding test circuits to assess whether the integrated circuit being tested is functioning properly.

The master controller 202 also includes an OCDS controller 212 connected by way of a data bus 214 to the slave target device 206. The slave target device 206 provides conductive paths (typically in the form of traces) connecting the data bus 214 to each of the integrated circuits IC1–IC4. A TMS signal generator 216 included in the master controller 202 is also connected to the data bus 214 and the JTAG controller 210 and provides a JTAG compliant state machine control signal (TMS) to each of the integrated circuits IC1 through IC4 as directed by the JTAG controller 210.

The master controller 202 also contains a switch controller 218 connected to the programmable switch 204. As described in detail below, the switch controller 218 provides a switch control signal used by the programmable switch 204 to connect the selected ones of the integrated circuits IC1–IC4 that are being tested to the JTAG controller 210 by way of the I/O lines 211. In a preferred embodiment, the connection between the JTAG controller 210 and the integrated circuits is in the form of a feedback loop. The feedback loop includes a feed forward path that the JTAG controller 210 uses to provide test instructions to the JTAG test circuit included in the integrated circuit under test. The JTAG test circuit responds back to the JTAG controller 210 with corresponding test results using the associated feed back path. By way of example, when the integrated circuit IC1 is to be the only integrated circuit to be functionally tested by the JTAG controller 210 using a corresponding JTAG test protocol, the switch controller 218 directs the programmable switch 204 to connect an I/O line 211-1 to a feed forward line 220 and the feed backward line 222 to an I/O line 211-2. In this way, the JTAG controller 210 is capable of testing only the integrated circuit IC1 without testing any of the other integrated circuits included in the slave target device 206.

Figure 3:
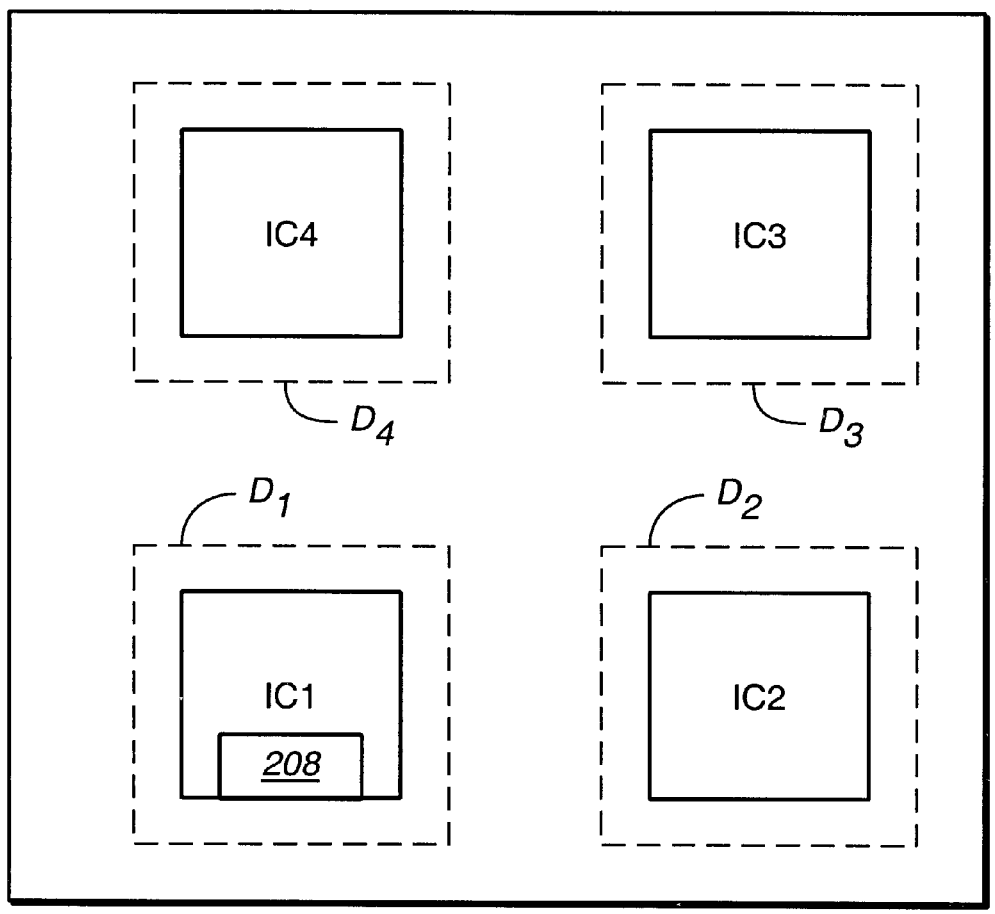
FIG. 3 is an illustration of a slave target device in accordance with an embodiment of the invention.

It should be noted that every location on the slave target device 206 that can accommodate an integrated circuit has associated with it a corresponding destination address (DA). In this way, the location of a particular integrated circuit accommodated on the slave target device 206 can be readily and uniquely identified. Once identified, the type of integrated circuit (i.e., JTAG, OCDS) at that particular location on the slave target device 206 can also be ascertained. FIG. 3 illustrates an exemplary slave target device 300 in accordance with an embodiment of the invention. As illustrated, each location on the slave target device 300 that can accommodate an integrated circuit, such as IC1 through IC4, has a destination address. In this particular case, IC1 is located at a position on the slave target device 300 corresponding to a destination address $D_1$, while IC2 is located at a position corresponding to a destination address $D_2$, etc. Per compliance with JTAG, a destination address corresponds to a bit location in a global bit frame.

By uniquely identifying each location on the slave target device, configuration data representative of a particular test configuration can be used to establish (or set up) a wide variety of testing situations. Continuing the example from above where the integrated circuit IC1 is the only one of IC1–IC4 to include an OCDS circuit 208, TABLE 1 represents possible configuration data that identify the integrated circuits included in the slave target device 300 to be tested and their respective types (i.e. JTAG only, OCDS).

TABLE 1

| Configuration Data | | | |
|---|---|---|---|
| Destination | AddressIC | IdentificationIC type | Tested? |
| D1 | IC1 | OCDS | yes |
| D2 | IC2 | JTAG | no |
| D3 | IC3 | JTAG | no |
| D4 | IC4 | JTAG | yes |

The configuration data shown in TABLE 1 provides the master controller 202 the locations of the integrated circuits to be tested and their respective types.

In order to set up a test environment represented by the configuration data shown in TABLE 1, master controller 202 provides the programmable switch 204 with the appropriate switch control signal that is based upon the destination addresses included in the configuration data. Testing priority data (i.e. The testing order) can also be included. For example, if the integrated circuit IC1 is to be the first integrated circuit to be tested, as described above, the master controller 202 provides a switch control signal $SC_{IC1}$ that directs the programmable switch 204 to form the feedback loop between the master controller 202 and the integrated circuit IC1. Once the feedback loop has been formed, the master controller 202 executes the appropriate test instructions in order to assess the functionality of the integrated circuit IC1. When the testing of IC1 has been completed, the process is repeated for all integrated circuits to be tested based upon the test protocol executed by the master controller 202.

The use of destination addresses to identify locations on the slave target device used to accommodate integrated circuits allows for great flexibility in creating a wide variety of testing environments. In the case of a defective integrated circuit a Boundary Scan Test, for example, can be performed using only the functional integrated circuits by simply identifying the destination address of the defective integrated circuit. The test protocol can then bypass using hardware the defective integrated circuit without resorting to expensive and time consuming re-wiring or replacement as is typical with conventional test networks.

In addition, in cases where particular integrated circuits to be tested are not yet available (i.e., those not yet designed, too expensive, etc.), the available integrated circuits can still be tested by again bypassing the location without an integrated circuit.

Figure 4:
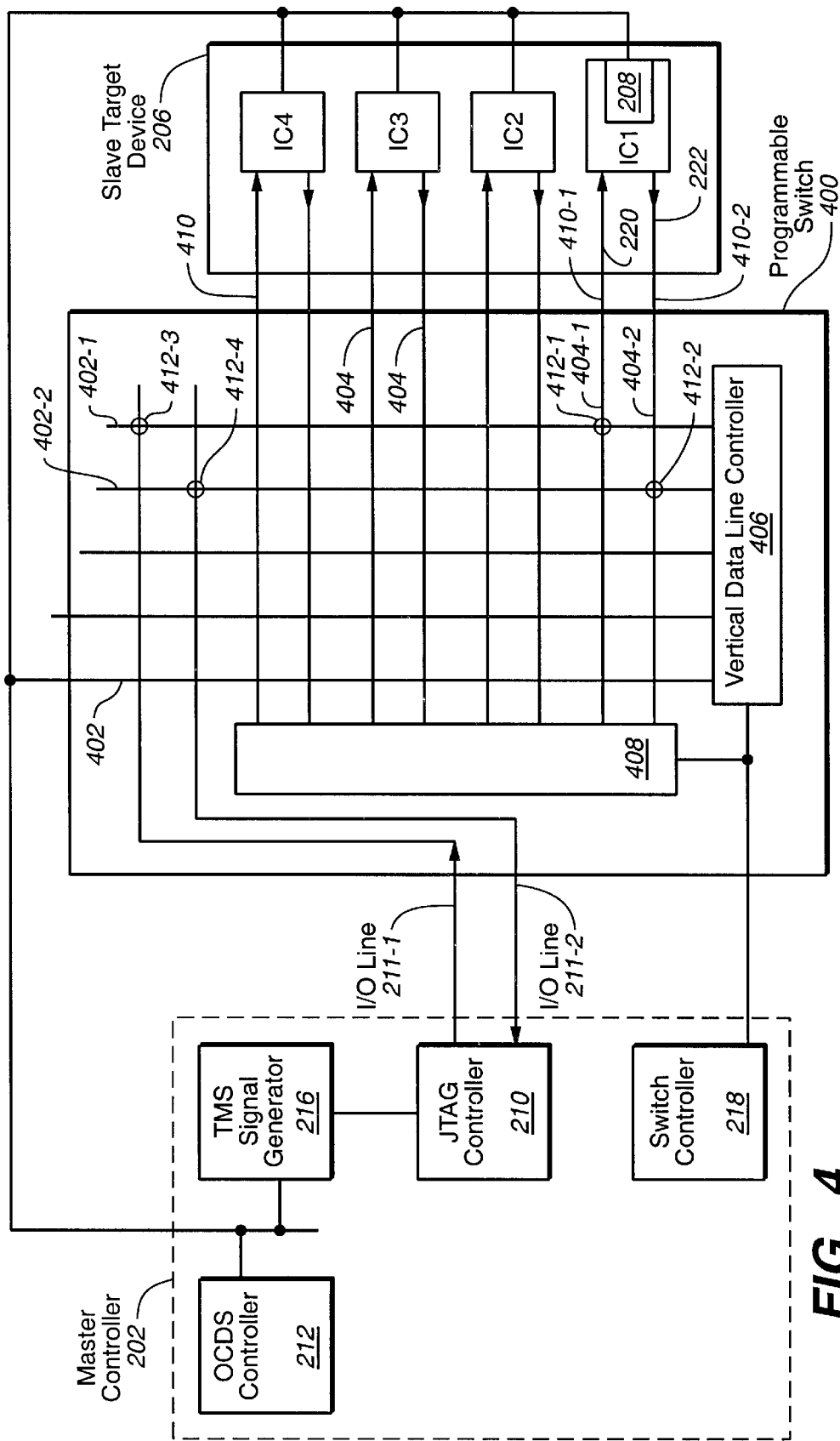
FIG. 4 is an illustration of a programmable switch in accordance with an embodiment of the invention.

Referring now to FIG. 4, an illustration of a programmable switch 400 in accordance with an embodiment of the invention is shown. It should be noted that the programmable switch 400 is but one possible embodiment of the programmable switch 204 shown in FIG. 2. The programmable switch 400 includes vertical data lines 402 programmably connected to horizontal data lines 404 forming what is referred to as a "crossbar" switch. The vertical data lines 402 and horizontal data lines 404 can be selectively electrically connected to each other using programmable connectors to provide a signal path suitable for passing control signals and data signals. It should be noted that for sake of clarity, only a few of the available programmable connectors are shown and that in practice a programmable connector is located at every horizontal and vertical data line intersect. The vertical data lines 402 are connected to a vertical data line controller 406 which is connected to the switch controller 218 while the horizontal data lines 404 are connected to a horizontal data line controller 408 also connected to the switch controller 218. Each of the horizontal data lines 404 is connected to one of the programmable switch I/O lines 410. Each of the programmable switch I/O lines 410 are in turn connected in a pair-wise manner to the integrated circuits IC1 through IC4 located on the target hardware device 206. By way of example, a horizontal data line 404-1 is connected to a programmable switch I/O line 410-1 while a horizontal data line 404-2 is connected to a programmable switch I/O line 410-2. Continuing the example above, the I/O lines 410-1 and 410-2 are, in turn, connected to the feed forward line 220 and the feed backward line 222.

In order to selectively connect the IC1 to the JTAG controller 210, the horizontal data line controller 408 uses programmable connectors 412-1 and 412-2 to connect the horizontal data line 404-1 to the vertical data line 402-1 and the horizontal data line 404-2 to the vertical data line 402-2. The vertical data line controller 406 uses the programmable connector 412-3 to connect the vertical data line 402-1 to the JTAG controller 210 by way of the I/O line 211-1. The vertical data line controller 406 then uses the programmable connector 412-4 to connect the vertical data line 402-2 to the JTAG controller 210 by way of the I/O line 211-2. In this way, a test feedback loop is formed between the JTAG controller 210 and the integrated circuit IC1. At this point, the master controller 202 can direct the JTAG controller 210 to execute the appropriate JTAG test protocols associated with the integrated circuit IC1 (or proprietary OCDS transactions).

In some situations, it may be desirable to serially connect (or daisy-chain) two or more integrated circuits. Such a situation occurs when a JTAG chain path is to be performed as described above. FIG. 5 illustrates a circuit configured to perform a boundary scan test on selected integrated circuits IC2 and IC3 in accordance with an embodiment of the invention. The programmable switch 400 uses others of the programmable connectors to form the appropriate testing circuit in the following manner. The switch controller 218 transmits the appropriate switch control signal to the horizontal data line controller 408 and the vertical data line controller 406. In this case, the horizontal data line controller 408 uses the programmable connector 412-5 to connect the vertical data line 402-3 to the horizontal data line 404-3 and uses the programmable connector 412-6 to connect the horizontal data line 404-4 to the vertical data line 402-4. The programmable connector 412-7 is used to connect the vertical data line 402-4 to the horizontal data line 404-5 while the programmable connector 412-8 is used to connect the horizontal data line 404-6 to the vertical data line 404-5. The vertical data line controller 406 then uses the programmable connector 412-9 to connect the vertical data line 402-4 to the JTAG controller 210 by way of the I/O line 211-1. The vertical data line controller 406 uses the programmable connector 412-10 to connect the vertical data line 402-3 to the JTAG controller 210 by way of the I/O line 211-2. In this way, the integrated circuits IC3 and IC2 can be tested without testing any other of the integrated circuits contained in the slave target device 206 and are daisy-chained in the JTAG path.

FIG. 6 illustrates an exemplary test network 600 in accordance with an embodiment of the invention. The test network 600 includes a master controller 602 coupled to programmable switch 604. The programmable switch 604 is in turn connected to a slave target device 606 having a microprocessor IC 608 as exemplified by the TRICORE™ line of microcontrollers manufactured by Siemens Microelectronics, Inc. of San Jose, Calif. The slave target device 606 also includes associated controller chips. Such controller chips include an I/O controller IC 610 and an address controller IC 612 both exemplified by corresponding ones of the VANTIS™ line of CPLD products manufactured by Advanced Micro Devices, Inc. of Sunnyvale, Calif. Accordingly, the microprocessor IC 608 includes an OCDS circuit 609 responsive to OCDS debug protocols executed by the master controller 602, whereas the I/O controller IC 610 and the address controller IC 612 are JTAG compliant only and as such are responsive to their own JTAG test protocols also executed by the master controller 602. Accordingly, the master controller 602 is configured to execute multiple test protocols as needed.

The master controller 602 contains a JTAG controller 614. The JTAG controller 614 includes "VANTIS" JTAG registers 616 arranged to store JTAG test protocol data specific for the integrated circuits being tested to the VANTIS test protocols. The JTAG controller 614 also includes "TRI-CORE" JTAG registers 618 arranged to store JTAG test protocol data specific for the microprocessor IC 608 consistent with TRICORE debug protocols. In this way, the master controller 602 is capable of providing either VANTIS test protocols or TRICORE debug protocols as needed. A reset (disable) register 620 is used to provide a TMS reset (disable) signal. The master controller 602 also includes an OCDS controller 622 programmably connected to the OCDS circuit 609 by way of the programmable switch 604. A clock circuit TCK provides a clock signal to each of the integrated circuits IC 608, IC 610, and IC 612.

The programmable switch 604 includes a first multiplexer 624 arranged to select a TDI signal corresponding to the type integrated circuit being tested. For example, if the master controller 602 is testing the microprocessor IC 608, then the first multiplexer 624 selects the TDI signal corresponding to the TRICORE JTAG test protocol. If, however, the master controller 602 is testing either or both of the VANTIS integrated circuits IC 610 and IC 612, then the first multiplexer 624 selects the TDI signal corresponding to the VANTIS test protocol. A second multiplexer 626 and a third multiplexer 628 provide for selection of TRS and TMS signals, respectively, according to the test protocols being used. A TRICORE result register 630 receives test results from the microprocessor IC 608 while a VANTIS result register 632 receives test results from the VANTIS integrated circuits IC 610 and IC 612. In the situation where a multiple IC test is to be performed, a selector 634 (that can be part of a virtual circuit) directs the output of the IC 608 to the input of the IC 610. In this way, a serial chain is formed.

FIG. 7 illustrates a test system 700 in accordance with an embodiment of the invention. The test system 700 includes a host computer 702 configured to provide executable instructions to a test network 703. The test network 703 includes a master controller 704 connected to a programmable switch 706. The programmable switch 706 is in turn connected to a slave target device 707 having integrated circuits 708 through 714 connected thereto.

During operation, the host computer 702 provides a user interface for selecting which of the integrated circuits 708 through 714 are to be tested. In this way, the test system 700 provides a flexible approach to functionally testing integrated circuits mounted on, for example, a printed circuit board. If a user desires to test only a single integrated circuit, IC 708 for example, the host computer provides the necessary configuration data to the master controller 704 which in turn directs the programmable switch 706 to selectively couple the IC 708 to the master controller 704. In the case where, for example, a boundary scan test is to be performed on IC 710 and IC 712, the host computer 702 provides corresponding configuration data to the master controller 704. The master controller 704 then directs the programmable switch 706 to connect only IC 710 and IC 712 in a serial manner to the master controller 704.

In some situations, one or more of the integrated circuits contained within the slave target device 707 is defective. In this situation, the host computer 702 provides instructions to the master controller 704 which it uses to direct the programmable switch 706 to bypass the defective integrated circuit without relying on the defective integrated circuit itself to provide the bypassing. In this way, the test system 700 provides a flexible approach to test system architectures which substantially eliminates the need to replace defective integrated circuits in order to perform functional testing on the printed circuit board. The test system 700 also provides for testing of systems where certain of the integrated circuits are not available due to, for example, late design cycle, limited availability, etc. In this way, the test system 700 provides for improved design cycle times since the testing of a printed circuit board, for example, can be performed in spite of problems related to individual integrated circuits.

The test system 700 also provides for the testing of integrated circuits having enhanced embedded chip debug circuits since the master controller 704 is capable of providing any number of desired JTAG protocols related to Boundary Scan, OCDS, etc.

FIG. 8 is an illustration of a test system 800 having a plurality of slave target devices. The test system 800 includes a host computer 802 connected to a master controller 804. The master controller 804 is in turn connected to a programmable switch 806 arranged to select any integrated circuit (not shown) contained in any of a number of slave target devices $TD_1$ through TDn. It should be noted, therefore, that any number of slave target devices, either remote or local, can be programmably connected to the programmable switch 806, as needed. In this way, any number of slave target devices can be located remotely from each other or from the master controller 804 as well as the host computer 802. This provides for the capability to functionally test integrated circuits contained on many different slave target devices located within, for example, a multi-processor computer system. In practice, a multi-processor computer system has a number of different slave target devices in the form of printed circuit boards (sometimes referred to as platforms) that typically take the form of "motherboards" and multiple "add-on boards" located at various locations within the system.

FIG. 9 illustrates one possible process flow 900 for testing integrated circuits in accordance with an embodiment of the invention. It should be noted that the process detailed in the following the discussion can be referenced to the test system 700 shown in FIG. 7. As shown, the test process begins by loading (902) the selected test protocols into the master controller. The test protocols can be stored in a host computer connected to the master controller, or the test protocols can be stored in a memory device connected to the memory controller. In either case, the test protocols provide the executable instructions for the master controller to properly test the integrated circuits. Once the proper test protocols have been loaded to the master controller, the master controller initializes (904) all registers, I/O ports, and the like. Once the master controller has been initialized, a test protocol is selected (906) based upon the integrated circuit to be tested. Once the test protocol has been selected, the configuration data associated with the selected test protocol are transmitted to the programmable switch (908). Once received, the programmable switch uses the configuration data to connect (910) the appropriate integrated circuit(s) to the master controller. The master controller then executes the selected test protocol (912) after which all the connections are closed (914). Once the connections are closed, the state machine for all integrated circuits tested are reset (916). A determination is then made to ascertain whether another test protocol is to be selected (918). If not, the testing process halts. However, if it is determined that another test protocol is to be selected, then a new test protocol is selected and the process continues.

FIG. 10 illustrates a typical computer system in accordance with an embodiment of the present invention. The computer system 1000 includes any number of processors 1002 (also referred to as central processing units, or CPUs) that are coupled to storage devices including primary storage 1006 (typically a random access memory, or RAM), primary storage 1004 (typically a read only memory, or ROM). As is well known in the art, primary storage 1004 acts to transfer data and instructions uni-directionally to the CPU and primary storage 1006 is used typically to transfer data and instructions in a bi-directional manner. Both of these primary storage devices may include any suitable of the computer-readable media described above. A mass storage device 1008 is also coupled bi-directionally to CPU 1002 and provides additional data storage capacity and may include any of the computer-readable media described above. The mass storage device 1008 may be used to store programs, data and the like and is typically a secondary storage medium such as a hard disk that is slower than primary storage. It will be appreciated that the information retained within the mass storage device 1008, may, in appropriate cases, be incorporated in standard fashion as part of primary storage 1006 as virtual memory. A specific mass storage device such as a CD-ROM 1014 may also pass data uni-directionally to the CPU 1002.

CPU 1002 is also coupled to an interface 1010 that includes one or more input/output devices such as such as video monitors, track balls, mice, keyboards, microphones, touch-sensitive displays, transducer card readers, magnetic or paper tape readers, tablets, styluses, voice or handwriting recognizers, or other well-known input devices such as, of course, other computers. Finally, CPU 1002 optionally may be coupled to a computer or telecommunications network using a network connection as shown generally at 1012. With such a network connection, it is contemplated that the CPU 1002 might receive information from the network, or might output information to the network in the course of performing the above-described method steps. The above-described devices and materials will be familiar to those of skill in the computer hardware and software arts.

The described arrangements have numerous advantages and permit testing of integrated circuits having enhanced embedded debug circuits. In addition, an optional test mode substantially increases the capability of performing fast testing of the integrated circuit using externally generated test vectors. The described test network and methods work well with a wide variety of integrated circuits such as for example, microprocessors and the like, fabricated with a wide range of processing technologies.

Although only a few embodiments of the present invention have been described in detail, it should be understood that the present invention may be embodied in many other specific forms without departing from the spirit or scope of the invention. Particularly, although the invention has been described primarily in the context of printed circuit boards, the advantages including flexible response to a wide variety of testing situations are equally applicable to any packaged integrated circuit.

Additionally, the testing characteristics can be varied in accordance with the needs of a particular system. By way of example, a manufacturer's particular test protocol can be used to test specific devices without resorting to developing new test procedures. This saves considerable engineering time and effort. Therefore, the present examples are to be considered as illustrative and not restrictive, and the invention is not to be limited to the details given herein, but may be modified within the scope of the appended claims.

What is claimed is:

1. An apparatus for testing a plurality of JTAG compliant integrated circuits, each of the integrated circuits having an associated test protocol, the apparatus comprising:

a master controller operable to perform the test protocol associated with each of the integrated circuits, the test protocol including an on-chip debug protocol;

a programmable switch for selectively forming test loops between the master controller and selected ones of the integrated circuits as directed by the master controller according to configuration data, the test loops for facilitating execution of selected ones of the test protocols;

a data bus for connecting the master controller to each of the integrated circuits, the data bus being configured to transmit data and control signals between the master controller and the integrated circuits, the data bus also being for facilitating execution of the on-chip debug protocol;

a JTAG controller connected to the data bus configured to execute a JTAG test protocol corresponding to the selected integrated circuit being tested;

an OCDS controller connected to the data bus configured to execute an on-chip debug support (OCDS) test protocol when the integrated circuit being tested is an OCDS integrated circuit; and a programmable switch controller connected to the programmable switch arranged to use the configuration data to provide a switch control signal that directs the programmable switch to connect, as needed, selected ones of the integrated circuits that are to be tested to the JTAG controller.

2. An apparatus as recited in claim 1, wherein at least one of the JTAG compliant integrated circuits is an on-chip debug support (OCDS) integrated circuit containing an embedded debug circuit.

3. An apparatus as recited in claim 2, wherein the JTAG test protocol tests a corresponding JTAG function of the JTAG compliant integrated circuit.

4. An apparatus as recited in claim 3, wherein OCDS test protocol tests a corresponding OCDS function of the OCDS integrated circuit.

5. An apparatus as recited in claim 1, wherein the programmable switch comprises:

a first group of I/O lines connected to the master controller;

a second group of I/O lines connected to the integrated circuit being tested;

a programmable cross bar switch having vertical data lines programmably connectable to horizontal data lines that are connected to the first and the second group of I/O lines;

a vertical selector connected to the switch controller arranged to select certain of the vertical data lines based upon the switch control signal; and a horizontal selector connected to the switch controller arranged to select certain of the horizontal data lines based upon the switch control signal, the selected vertical data line and horizontal data line being programmably connected, as needed, to provide an electrical signal path between selected ones of the first group of I/O lines and selected ones of the second group of I/O lines to form a feedback loop connection between the master controller and the integrated circuit being tested.

6. An apparatus as recited in claim 1, wherein the programmable switch includes a multiplexer used to connect the selected integrated circuits to the master controller.

7. An apparatus as recited in claim 1, further including a slave target device connected to the programmable switch having at least one of the selected integrated circuits.

8. An apparatus as recited in claim 7, wherein the slave target device is a printed circuit board.

9. An apparatus as recited in claim 8, wherein the master controller is a multi-master controller arranged to substantially simultaneously execute a plurality of JTAG test protocols and OCDS test protocols as well as provide a plurality of switch control signals to the programmable switch in order to test the selected integrated circuits in parallel.

10. An apparatus as recited in claim 9, wherein the control signals are OCDS control signals provided by the OCDS controller and the data signals are OCDS data signals generated by the OCDS circuit contained in the OCDS integrated circuit.

11. An apparatus as recited in claim 10, wherein the test network includes a plurality of slave target devices included in a multiprocessor computer system.

12. A test system for testing a plurality of integrated circuits each having a test protocol associated therewith, at least one of the integrated circuits comprising an embedded debug circuit having an on-chip debug protocol associated therewith, the test system comprising:

a host computer connected to the apparatus recited in claim 6 arranged to provide selected test protocols, as needed, to the master controller.

13. A test system as recited in claim 12, wherein the integrated circuits are contained within a slave target device.

14. A test system as recited in claim 13, wherein the slave target device is a printed circuit board.

15. A test system as recited in claim 14, wherein the slave target device is included in a multiprocessor computer system.

* * * * *